United States Patent [19]
Birkner et al.

[11] Patent Number: 5,293,133
[45] Date of Patent: Mar. 8, 1994

[54] METHOD OF DETERMINING AN ELECTRICAL CHARACTERISTIC OF AN ANTIFUSE AND APPARATUS THEREFOR

[75] Inventors: John M. Birkner, Portola Valley; David T. Martin, Santa Clara; Richard J. Wong, Milpitas, all of Calif.

[73] Assignee: QuickLogic Corporation, Santa Clara, Calif.

[21] Appl. No.: 937,071

[22] Filed: Aug. 27, 1992

[51] Int. Cl.$^5$ .............................................. G11C 17/16
[52] U.S. Cl. ................................... 324/713; 324/719; 257/530; 307/202.1; 307/465; 365/96
[58] Field of Search ............... 257/50, 530; 307/202.1, 307/465; 324/522, 525, 713, 718, 719, 158 R; 365/96, 189.08, 225.7; 437/922

[56] References Cited

U.S. PATENT DOCUMENTS

| | | | |
|---|---|---|---|
| 4,595,875 | 6/1986 | Chan et al. | 324/522 |
| 4,651,409 | 3/1987 | Ellsworth et al. | |
| 4,698,589 | 10/1987 | Blankenship et al. | 324/158 R |
| 4,748,490 | 5/1988 | Hollingsworth | 257/530 |
| 4,758,745 | 7/1988 | El Gamal et al. | 307/465 |
| 4,783,763 | 11/1988 | Bergman | 365/94 |
| 4,823,181 | 4/1989 | Mohsen et al. | 257/530 |
| 4,857,774 | 8/1989 | El-Ayat et al. | 307/465 |
| 4,873,459 | 10/1989 | El Gamal et al. | 307/465 |
| 4,910,417 | 3/1990 | El Gamal et al. | 307/465 |
| 4,933,898 | 6/1990 | Gilberg et al. | 365/53 |
| 4,969,124 | 11/1990 | Luich et al. | 365/225.7 X |
| 5,008,855 | 4/1991 | Eltoukhy et al. | 365/96 |
| 5,070,384 | 12/1991 | McCollum et al. | 257/530 |
| 5,126,282 | 6/1992 | Chiang et al. | 437/922 X |
| 5,130,777 | 7/1992 | Galbraith et al. | 257/530 |
| 5,140,554 | 8/1992 | Schreck et al. | 365/201 |
| 5,166,556 | 11/1992 | Hsu et al. | 307/465 |
| 5,187,393 | 2/1993 | El Gamal et al. | 307/465.1 |
| 5,194,759 | 3/1993 | El-Ayat et al. | 307/202.1 |
| 5,196,724 | 3/1993 | Gordon et al. | 257/530 |

FOREIGN PATENT DOCUMENTS

416903A2 3/1991 European Pat. Off. .

OTHER PUBLICATIONS

Chiang et al, "Oxide-Nitride-Oxide Antifuse Reliability", IEEE; Cat. No. 90CH2787-O, pp. 186-192; Mar. 1990.

Handy, E., et al. "Dielectric Based Antifuse for Logic and Memory ICs", IEEE Aug. 1988, 786-IEDM 88, 4 pages.

Primary Examiner—Kenneth A. Wieder
Assistant Examiner—Christopher Tobin
Attorney, Agent, or Firm—Skjerven, Morrill, MacPherson, Franklin & Friel

[57] ABSTRACT

A method for determining an electrical characteristic (such as a resistance) of an antifuse of a programmable device. The method comprises the steps of: 1) before the antifuse is programmed, determining an electrical characteristic (such as a voltage, current and/or resistance) of a first conductive path which includes a series element disposed electrically in series with a parallel element, the parallel element being controlled to be substantially conductive, the parallel element being disposed electrically in parallel with the unprogrammed antifuse; 2) after programming of the antifuse, determining an electrical characteristic (such as a voltage, current and/or resistance) of a second conductive path including the series element disposed electrically in series with the programmed antifuse when the parallel element is controlled to be substantially nonconductive; 3) determining an electrical characteristic (such as a voltage, current and/or resistance) of a third, conductive path through the series element, and through the programmed antifuse and the parallel element, the parallel element being controlled to be substantially conductive; and 4) determining the electrical characteristic (such as a resistance) of the antifuse based on the above three determinations in 1), 2) and 3). The method is usable to determine whether or not programmed antifuses of a programmable device have low enough resistances to meet desired reliability criteria.

35 Claims, 7 Drawing Sheets

METHOD OF DETERMINING AN ELECTRICAL CHARACTERISTIC OF AN ANTIFUSE AND APPARATUS THEREFOR

FIELD OF THE INVENTION

This invention relates to programmable devices which comprise antifuses. More particularly, this invention relates to determining an electrical characteristic of an at least partially programmed antifuse of a programmable device such as a field programmable gate array.

BACKGROUND INFORMATION

A field programmable device (or a so-called "field programmable gate array") is a versatile integrated circuit chip, the internal circuitry of which may be configured by an individual user to realize a user-specific circuit. To configure a field programmable device, the user configures an on-chip interconnect structure of the field programmable device so that selected inputs and selected outputs of selected on-chip logic components are connected together in such a way that the resulting circuit is the user-specific circuit desired by the user.

Figure 1A:
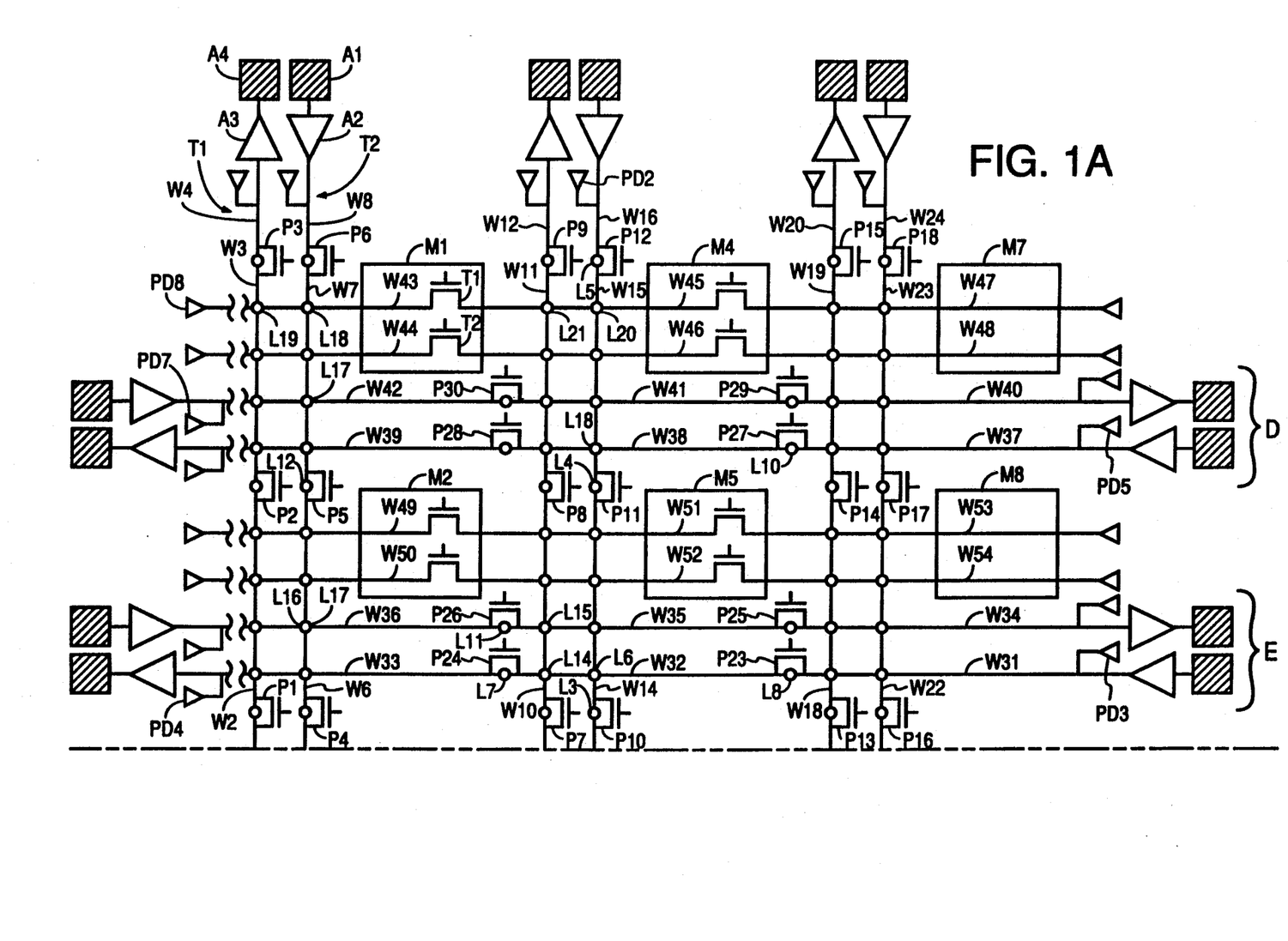
FIGS. 1A-1B are a top down simplified diagram illustrating a corner portion of a large field programmable device.
Figure 1B:
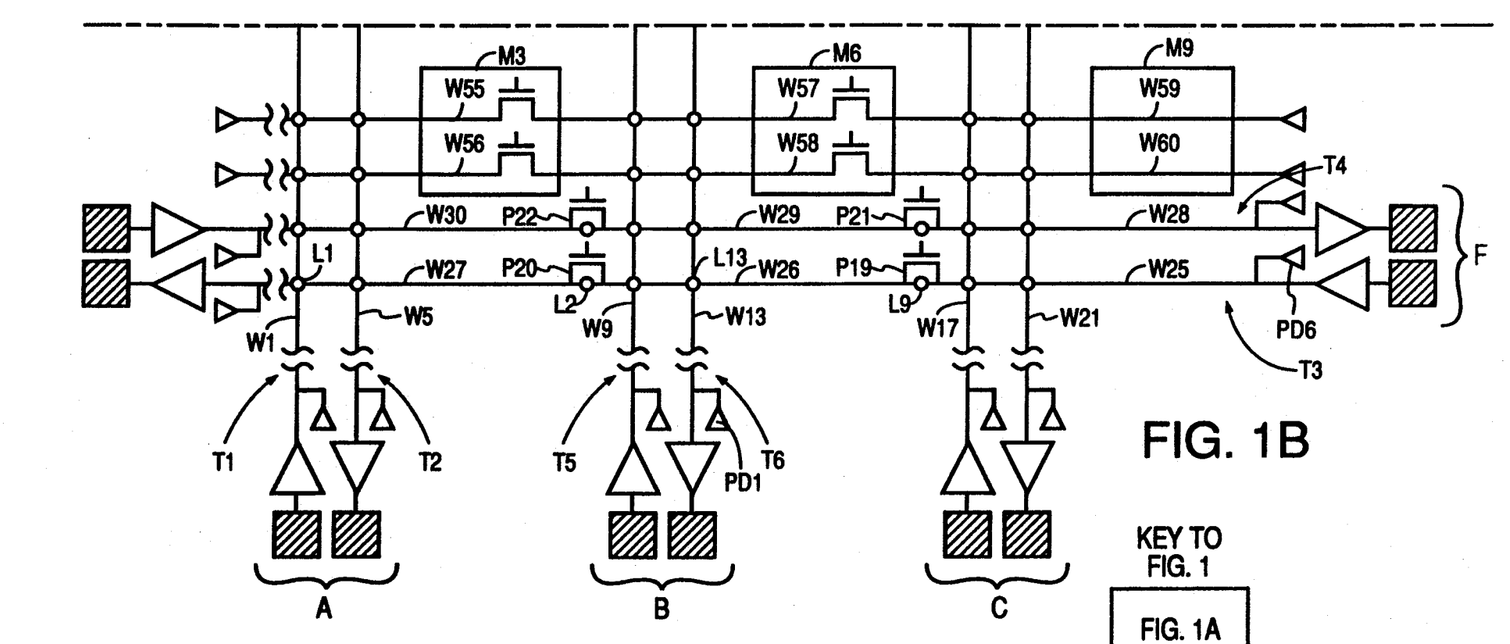

FIG. 1A-1B is a top down simplified diagram illustrating a corner portion of a field programmable device. Three vertical routing channels A-C and three horizontal routing channels D-F separate nine universal logic modules M1-M9. These nine logic modules are arranged in a three-by-three matrix. Each logic module may, for example, comprise logic components such as digital logic gates, digital sequential logic circuitry, and other logic circuitry.

In the vertical dimension, routing channel A, for example, comprises two tracks T1 and T2. Track T1, for example, comprises wires W1, W2, W3, and W4. A transistor P1, called a pass transistor, is connected between wires W1 and W2. A second pass transistor P2 is connected between wires W2 and W3. A third pass transistor P3 is connected between wires W3 and W4. The other illustrated wires W5-W24 and the other illustrated pass transistors P4-P18 of the vertical tracks of FIGS. 1A-1B are similarly numbered.

In the horizontal dimension, routing channel F, for example, comprises two tracks T3 an T4. Track T3, for example, comprises wires W25, W26, and W27. A pass transistor P19 is connected between wires W25 and W26. A pass transistor P20 is connected between wires W26 and W27. The other illustrated wires W28-W42 and the other illustrated pass transistors P21-P30 of the horizontal tracks of FIG. 1A-1B are similarly numbered.

Each of the small circles in FIG. 1A-1B represents an unprogrammed connection element referred to as a programmable "antifuse". In contrast to typical fuses used in programmable read-only memory (PROM) devices which are normally conductive and are "blown" to be nonconductive, antifuses are normally nonconductive and are "programmed" to be conductive.

Due to the large number of antifuses in the structure represented by FIG. 1A-1B, only certain of the antifuses are supplied with reference numerals. Some of the antifuses, called "cross antifuses", are located substantially at the cross points of horizontal and vertical wires. These cross antifuses can be programmed to connect a horizontal wire with a vertical wire.

Figure 2:
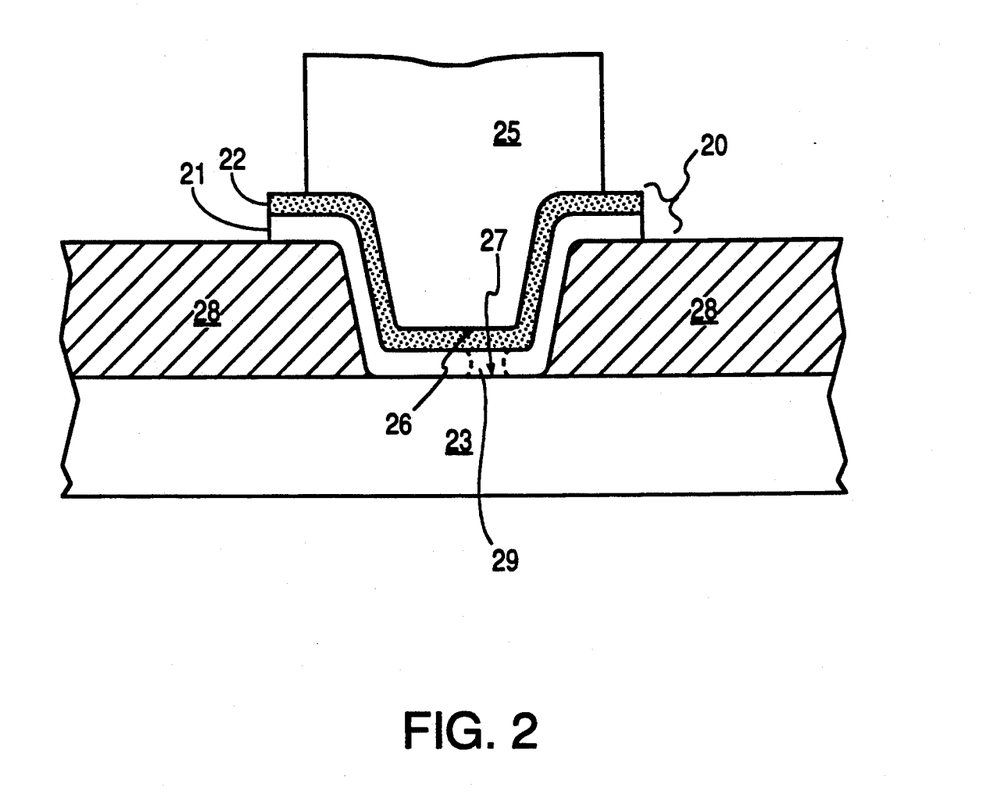
FIG. 2 is a cross sectional view of one possible embodiment of a cross antifuse the resistance of which is determinable using a method of the present invention.

FIG. 2 is a cross sectional view of one possible embodiment of a cross antifuse. Cross antifuse 20 comprises a thin dielectric body layer 21 and a layer of diffusible conductive material 22 sandwiched between horizontal wire 23 and vertical wire 25 so that a first surface portion 26 of the antifuse contacts vertical wire 25 and so that a second surface portion contacts horizontal wire 23. The horizontal wire 23 may, for example, be located on a first metallization layer of the programmable device whereas the vertical wire 25 may be located on a second metallization layer of the programmable device. An insulating layer 28 may be disposed between the first metallization layer and the second metallization layer so that the cross antifuse forms a via-like structure from the vertical wire 25 down to the horizontal wire 23. In its unprogrammed state, horizontal wire 23 is insulated from vertical wire 25 by dielectric body layer 21. In its programmed state, a conductive path 29 is formed through body layer 21 so that horizontal wire 23 and vertical wire 25 are substantially electrically connected. One such cross antifuse L1 is disposed between a vertical wire W1 and a horizontal wire W27 in the circuit of FIG. 1A-1B.

Other of the antifuses, called "pass antifuses", may be programmed to electrically connect the source and drain of a pass transistor together so that two adjacent wires in a single track are connected together in series independent of the state of the pass transistor. One such pass antifuse which may be programmed to connect horizontal wire W26 to horizontal wire W27 is pass antifuse L2.

The field programmable device of FIG. 1A-1B also has input/output circuitry for interfacing the user-defined circuit of the interconnected logic modules to other circuitry off-chip. A signal originating from off-chip may, for example, be input onto vertical wire W8 via I/O pad A1 and input I/O buffer A2. A signal on vertical wire W4 generated on-chip may, for example, be output to circuitry off-chip via output I/O buffer A3 and output I/O pad A4.

Each of the modules M1-M9 has digital signal input wires and digital signal output wires. Module M1, for example, has a single digital signal input wire W43 entering module M1 from the left and a single digital signal output wire W44 exiting module M1 to the left. Module M4 has an input wire W45 and an output wire W46. Although the modules in the device of FIGS. 1A-1B each have only one input wire and one output wire, each module of an actual device may have a great number of digital signal wires. To connect these digital signal input and output wires to the rest of the interconnect circuitry, cross antifuses are provided on each digital signal input wire and each digital signal output wire where the input or output wire crosses a vertical wire. Input wire W43, for example, has two cross antifuses L18 and L19. Input wire W45 has two cross antifuses L20 and L21. Transistors, such as transistor T1, are provided to connect adjacent ones of these digital signal wires together during programming of cross antifuses.

Although FIG. 1A-1B shows wires W1, W5, W9, W13, W17 and W21 as single wires connected between I/O buffers and cross antifuses, additional rows of logic modules and associated horizontal routing channels are disposed between the bottom row of cross antifuses and the bottom row of I/O buffers and I/O pads. Similarly, additional columns of logic modules and associated vertical routing channels are disposed between the leftmost column of cross antifuses and the leftmost column of I/O buffers and I/O pads. The structure of FIG. 1A-1B is therefore a simplified representation of an upper right corner portion of a larger field programmable device.

To realize a desired circuit from the unprogrammed structure of FIG. 1A-1B, selected antifuses in the structure are programmed so that various of the wires W1-W60 are connected together to form an interconnect net from one specific output of a specific digital logic component in a module to one or more specific inputs of other specific digital logic components in another module. The antifuses in FIG. 1A-1B are programmed when a high programming voltage (Vpp) having a magnitude greater that the normal operating voltage supply of the programmable device is placed across the antifuse. If, for example, the normal operating voltage is approximately 5 volts plus or minus 10 percent, placing a programming voltage Vpp of having a magnitude greater than approximately 11 volts across an antifuse will cause the antifuse to become conductive. Unprogrammed antifuses may have a conductivity of approximately 1-50 gigaohms or more whereas programmed antifuses may have a conductivity of approximately 50 ohms or less.

Figure 3:
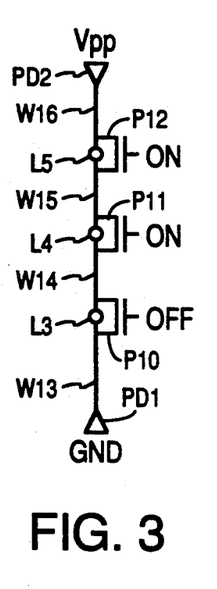
FIG. 3 shows the programming of a pass antifuse L3 in the field programmable device of FIG. 1A-1B.

FIG. 3 shows one way of programming pass antifuse L3 in the field programmable device of FIG. 1A-1B. In the circuit shown in FIG. 1A-1B, each end of track T6 has a programming driver. Programming driver PD1 is connected to vertical wire W13 and programming driver PD2 is connected to vertical wire W16. These programming drivers have tri-state outputs so that they can be disconnected from wires W13 and W16 during normal circuit operation. During the programming of antifuses, however, these programming drivers may be controlled to output a voltage such as programming voltage (Vpp), or may be controlled to output a ground voltage.

In the example shown in 3, pass antifuse L3 is to be programmed. Pass transistors P12 and P11 are turned on whereas pass transistor P10 is not turned on. Programming driver PD2 is controlled to drive vertical wire W16 with the programming voltage Vpp and programming driver PD1 is controlled to drive wire W13 with a ground voltage. Because pass transistors P12 and P11 are turned on and pass transistor P10 is turned off, programming voltage Vpp propagates to wire W15 and then to wire W14. A significant portion of programming voltage Vpp is therefore dropped between wire W14 and wire W13 across pass antifuse L3. Consequently, antifuse L3 is programmed to be conductive. Antifuses L4 and L5 are not programmed because conductive pass transistors P11 and P12 prevent a large voltage from developing across antifuses L4 and L5 respectively. Antifuse L3, on the other hand, is programmed because pass transistor P10 is not conductive and does not prevent the programming voltage from developing across antifuse L3. Programming of antifuse L3 causes the first surface portion of antifuse L3 to be permanently electrically connected to the second surface portion of antifuse L3.

When selected antifuses of a programmable device are programmed to realize a desired user-specific circuit, however, reliability problems are sometimes encountered. The resistances of some of the programmed antifuses, for example, have been observed to change. As a result of such changes in antifuse resistance, user-specific circuits realized on prototype programmable devices have been observed to fail in laboratory testing.

SUMMARY OF THE INVENTION

Figure 4:
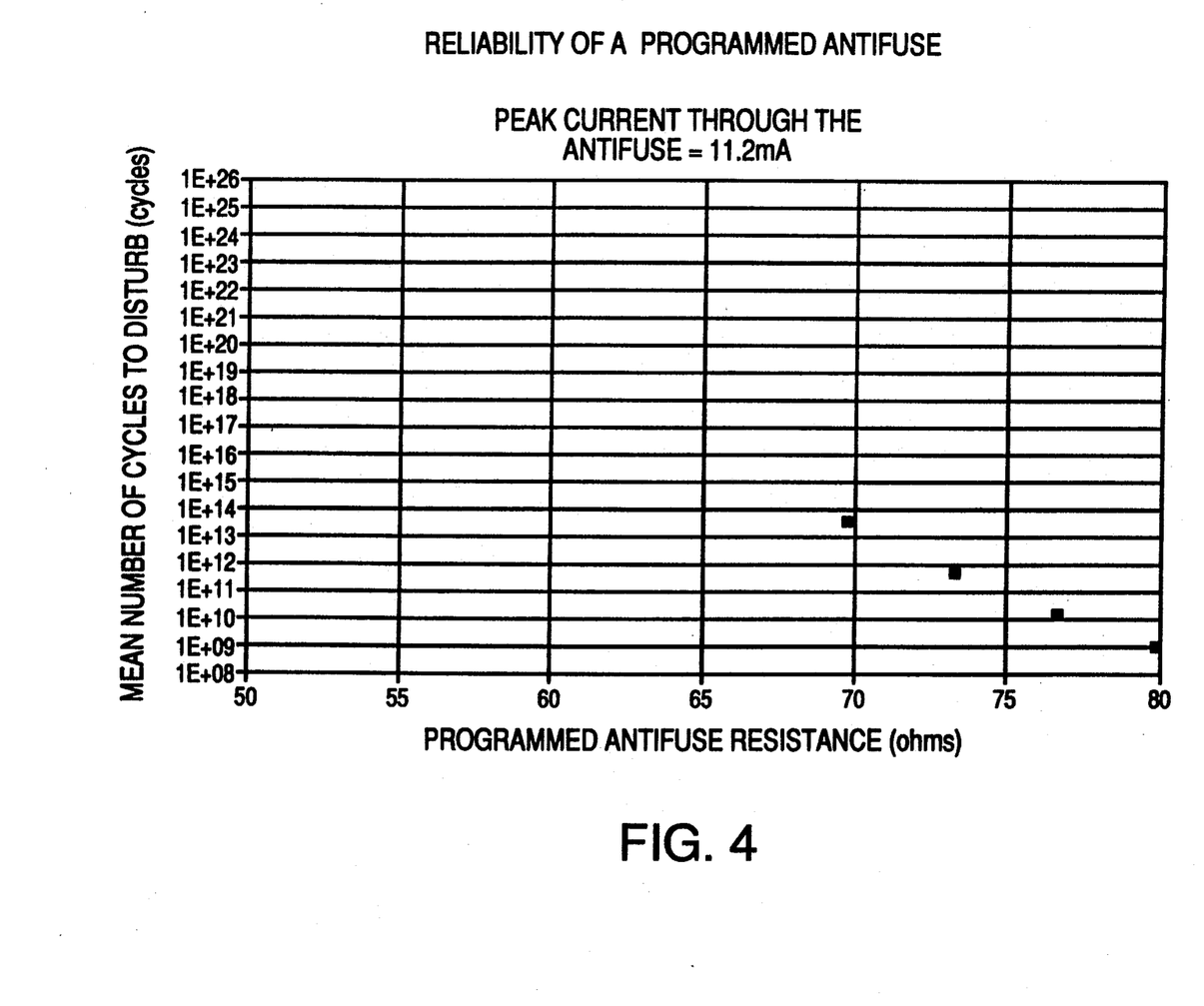
FIG. 4 is a graph showing programmed amorphous silicon antifuse resistance versus mean number of switching cycles at a peak current of approximately 11.2 mA found to cause a change in programmed antifuse resistance.

A relationship between the reliability of a programmed antifuse and the resistance of the programmed antifuse has been discovered. FIG. 4 shows a resistance of one configuration of an amorphous silicon programmed antifuse versus the mean number of switching cycles which have been found to cause a change in programmed antifuse resistance. As indicated by FIG. 4, an amorphous silicon antifuse programmed to have a higher programmed resistance may exhibit a lower reliability than it would have had it been programmed to have a lower programmed resistance. Accordingly, if after antifuse programming, the resistances of the programmed antifuses could be determined, then the reliability of the programmed antifuses of the programmable device could also be determined. As a result, the reliability of the user-specific circuit realized on the programmable device could be checked. Unsatisfactorily unreliable programmable devices could be identified and either discarded or programmed further to improve their reliability.

The antifuses of a programmable device are, however, typically disposed on the integrated circuit chip of the programmable device in such a way that the antifuses are relatively inaccessible to connection to external resistance measuring equipment. The structure of antifuse L3 in the field programmable device of FIG. 1A-1B, for example, is located underneath a passivation layer (not shown) which covers substantially all of the top surface of the integrated circuit chip. Moreover, the entire integrated circuit chip of the programmable device of FIG. 1A-1B may be encapsulated in plastic of a plastic package (not shown) or may be contained in a cavity of a ceramic package (not shown) at the time when antifuse resistance is to be measured after packaging.

Therefore, if equipment were to be connected to the integrated circuit of FIG. 1A-1B to measure the resistance of programmed antifuse L3, then selected parts of the interconnect matrix of wires, pass transistors, and/or other antifuses would have to be used in order to establish the necessary electrical connections between the off-chip measuring equipment and the on-chip antifuses of interest L3. Accordingly, a portion of the resistance measured by the measuring equipment would be the resistance of the interconnect matrix and not the resistance of the programmed antifuse L3.

A method for determining an electrical characteristic such as a resistance of an antifuse of a programmable device is therefore disclosed. In accordance with one embodiment of the present invention, a method of determining an electrical characteristic (such as a resistance) of an antifuse of a programmable device, comprises the steps of:

(a) determining an electrical characteristic (such as a resistance) of a first conductive path, the first conductive path comprising a series element disposed electrically in series with a parallel element, the parallel element being controlled to be substantially conductive;

(b) after at least partly programming the antifuse and after step (a), determining an electrical characteristic (such as a resistance) of a second conductive path, the second conductive path comprising the series element disposed electrically in series with the antifuse, the parallel element being controlled to be substantially nonconductive;

(c) after step (b), determining an electrical characteristic of a third conductive path, the third conductive path comprising the series element disposed electrically in series with the antifuse and the parallel element, the antifuse and the parallel element being disposed electrically in parallel with respect to each other, the parallel element being controlled to be substantially conductive; and (d) determining the electrical characteristic (such as the resistance) of the antifuse based at least in part on the electrical characteristic determined in step (a), the electrical characteristic determined in step (b), and the electrical characteristic determined in step (c).

By using the above method, it is possible to determine the resistance of a programmed antifuse of a programmable device from outside the integrated circuit package of the programmable device. In some embodiments of the invention, if the reliability of a programmed antifuse is determined using this method to be unacceptable, then the antifuse is programmed further to reduce the resistance of the antifuse, thereby improving overall reliability of the user-specific circuit realized on the programmable device.

In other embodiments of the invention, the determined resistance of a programmed antifuse is used to estimate the switching speed of speed critical nets. Accordingly, if the resistance of a programmed antifuse in a speed critical net would result in the switching speed of the net being too slow, then the antifuse is programmed further to reduce antifuse resistance or additional measures are taken to increase the switching speed of the critical net.

DETAILED DESCRIPTION OF THE PREFERRED EMBODIMENTS

Figures 5A, 5B:
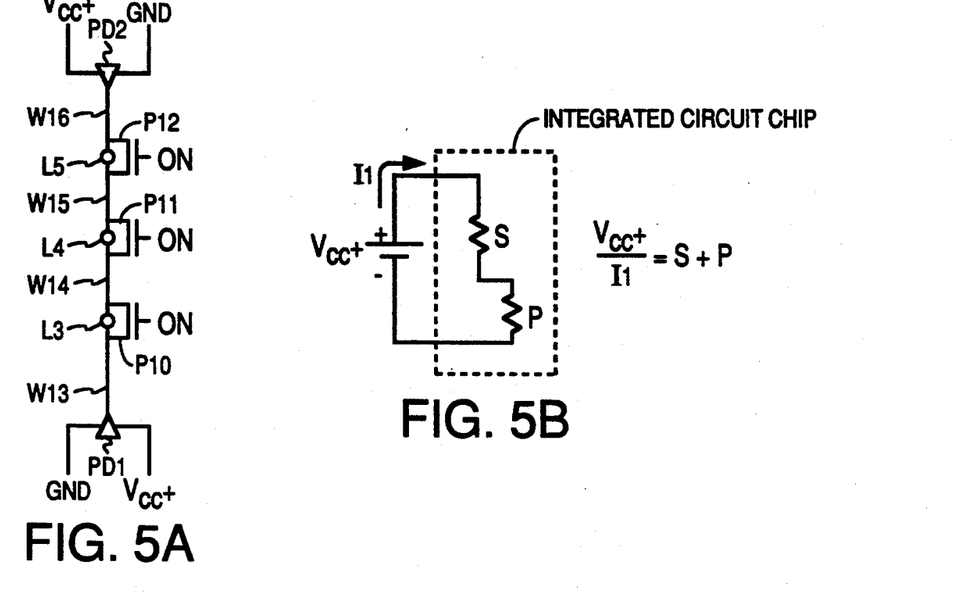
FIGS. 5A-5F are diagrams depicting various stages in a method in accordance with the present invention.

FIGS. 5A and 5B illustrate a step in accordance with one embodiment of the present invention. FIG. 5A illustrates a conductive path extending from a Vcc+ voltage source to a GND voltage source. In the embodiment shown in FIGS. 5A and 5B, a first programming driver PD1 is powered from a Vcc+ voltage and from a ground voltage GND and is controlled to drive wire W13 with the ground voltage. A second programming driver PD2 is also powered from the Vcc+ voltage and from the ground voltage GND and is controlled to drive wire W16 with the Vcc+ voltage. The difference in electrical potential between the Vcc+ voltage and the ground voltage GND is greater than the magnitude of Vcc, the normal circuit operating supply voltage but is typically less than the magnitude of a programming voltage Vpp used to program antifuses. The Vcc+ voltage source is, in some embodiments, an off-chip voltage source which supplies the Vcc+ voltage to the programmable device via one terminal (such as a programming current pin) of the integrated circuit package of the programmable device. If, for example, only one current path is formed on-chip, then the magnitude of the total current supplied to the programming current pin will be indicative of the current flowing in the current path on-chip. The source of the ground voltage GND is, in some embodiments, also an off-chip voltage source.

As illustrated in FIG. 5A, a conductive path is formed from the source of the Vcc+ voltage, into the integrated circuit chip package of the programmable device, through programming driver PD2, through wire W16, through conductive pass transistor P12, through wire W15, through conductive pass transistor P11, through wire W14, through conductive pass transistor P10, through wire W13, through programming driver PD1, and from the integrated circuit chip to an off-chip source of the ground voltage GND. In this illustrative conductive path, all the antifuses L3, L4 and L5 are unprogrammed.

FIG. 5B is a circuit diagram illustrating the conductive path of FIG. 5A. Parallel resistance P represents the resistance of conductive pass transistor P10 whereas series resistance S represents the resistance of the remainder of the conductive path. With transistors P10, P11 and P12 turned on to be at least substantially conductive, with programming driver PD2 outputting the Vcc+ voltage, and with programming driver PD1 outputting the ground voltage GND, the current I1 flowing from the source of the known Vcc+ voltage to the source of the known ground voltage GND through the circuitry of the programmable device is measured. Accordingly, the following relationship is determined.

$$\frac{V_{CC+}}{I1} = S + P \qquad (1)$$

$\frac{V_{CC+}}{I1}$ is a calculatable value and therefore a known value whereas S and P are each unknown resistances.

After the determination illustrated in FIGS. 5A and 5B is made, the antifuse L3 disposed in parallel with the parallel resistance P is at least partially programmed. This programming is, in some embodiments, accomplished by switching pass transistor P10 off, leaving pass transistors P11 and P12 on, increasing the voltage output by programming driver PD2 up to a programming voltage Vpp, and leaving programming driver PD1 outputting ground voltage GND onto wire W13. Accordingly, a substantial portion of the programming voltage Vpp is dropped across antifuse L3 so that antifuse L3 is at least partially programmed. In some embodiments, multiple pulses of programming current may be made to flow in alternating directions through the antifuse being programmed.

Figures 5C, 5D:
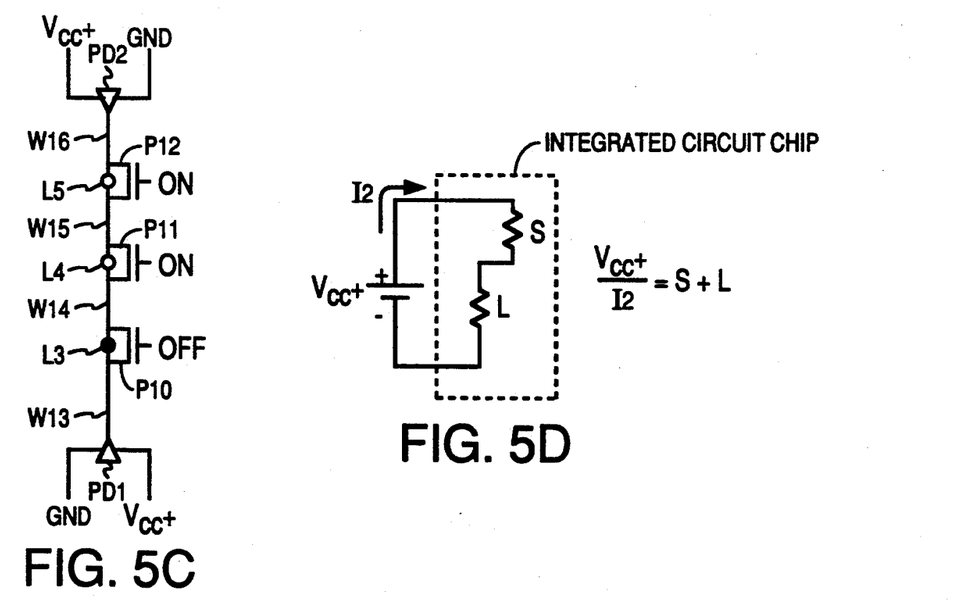

FIGS. 5C and 5D illustrate another step in accordance with one embodiment of the present invention wherein the pass transistor P10 disposed in parallel with antifuse L3 is turned off. The current I2 flowing through the programmed antifuse L3 is then measured with pass transistors P11 and P12 turned on, with programming driver PD2 being supplied with the Vcc+ voltage rather than the programming voltage, and with programming driver PD1 driving wire W13 with the ground voltage GND.

FIG. 5D is a circuit diagram illustrating the conductive path of FIG. 5C. Resistance L represents the resistance of the at least partially programmed antifuse L3. Resistance P is not shown in FIG. 5D because pass transistor P10 is turned off and is therefore substantially nonconductive. Accordingly, the following relationship is determined.

$$\frac{V_{CC+}}{I2} = S + L \quad (2)$$

$\frac{V_{CC+}}{I2}$ is a calculatable value and therefore a known value whereas S and L are each unknown resistances.

Figure 5E:
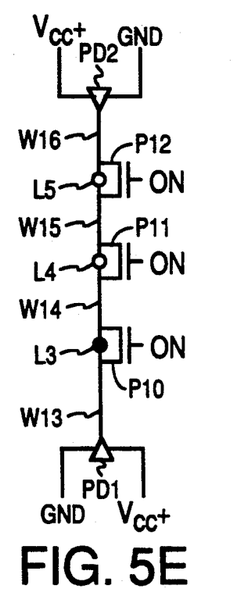
Figure 5F:
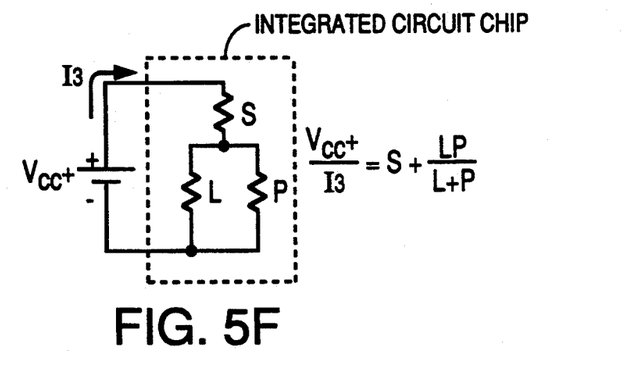

FIGS. 5E and 5F illustrate another step in accordance with the present invention wherein pass transistor P10 is turned on, pass transistors P11 and P12 are on, programming driver PD2 continues to be supplied with the Vcc+ voltage, programming driver PD1 continues to drive wire W13 with the ground voltage GND, and wherein the current I3 flowing to the ground voltage GND from the off-chip source of the Vcc+ voltage is measured. FIG. 5F is a circuit diagram illustrating the conductive path of FIG. 5E. Accordingly, the following relationship is determined.

$$\frac{V_{CC+}}{I3} = S + \frac{LP}{L+P} \quad (3)$$

$\frac{V_{CC+}}{I3}$ is a calculatable value and therefore a known value whereas S, P and L are each unknown resistances.

Equations 1, 2 and 3 constitute a solvable system of three equations of three unknowns, S, P and L. This system of equations is then solved to find L, the resistance of programmed antifuse L3.

$$L = \left(\frac{V_{cc+}}{I2} - \frac{V_{cc+}}{I3}\right)\left(1 \pm \sqrt{1 - \frac{\frac{V_{cc+}}{I2} - \frac{V_{cc+}}{I1}}{\frac{V_{cc+}}{I2} - \frac{V_{cc+}}{I3}}}\right) \quad (4)$$

The system of three equations is also of course solvable to find resistances P and S.

In some embodiments, the present invention is incorporated into a method for programming different antifuses of a single programmable device to have different programmed resistances. It has been found that when the operating current of an antifuse reaches a substantial proportion of the programming current used to program the antifuse, then the resistance of that programmed antifuse may change due to the high operating current changing the physical structure of the antifuse. Because the programmed resistance of some antifuses has been found to correlate with the magnitude of the programming current used to program those antifuses, programmed antifuses through which small amounts of operating current will flow during normal circuit operation can be programmed to have relatively higher programmed resistances whereas programmed antifuses through which larger amounts of operating current will flow during normal circuit operation can be programmed to have relatively lower programmed resistances.

The method of the present invention for determining the resistance of a programmed antifuse is therefore usable to determine whether or not the resistance of a programmed antifuse is adequately low for the peak operating current which will flow through it during normal operation. If, for example, the resistance of a programmed antifuse is determined by the present invention not to be adequately low for the magnitude of the operating current which will flow through that antifuse during normal circuit operation, then the antifuse should undergo additional programming with a higher programming current so that the programmed antifuse resistance will be reduced to a satisfactorily low resistance. If, on the other hand, the resistance of the programmed antifuse is determined by the present invention to be adequately low for the magnitude of the operating current which will flow through that antifuse during normal circuit operation, then additional antifuse programming is not required.

Because equation 4 contains differences, $(V_{cc+}/I2) - V_{cc+}/I3)$ and $(V_{cc+}/I2 - V_{cc+}/I1)$, where I1, I2 and I3 may, in practice, be very close in value, it is necessary to measure currents, I1, I2 and I3 to a very precise degree. The degree of precision of the current measurement directly affects the resistance calculation, and poor precision can render the results virtually useless in reliability determination. State of the art programmers such as the Data I/O Unisite or the Actel Activator do not have the required resolution for measuring these currents. Accordingly, a programmer is disclosed:

a) which is capable of controlling the current conductive path through the programmable device by switching transistors on and off with on-chip shift registers, which the programmer loads using a shift clock and a shift-data-in signal; and b) which is capable of measuring the current supplied to the conductive current path to at least ±20 microamps in a range of at least 40 milliamps while applying a voltage such as voltage Vcc+ across the conductive path.

Although certain specific exemplary embodiments have been described above in order to illustrate the invention, the invention is not to be considered limited to the above described specific embodiments. It is to be understood, for example, that the voltages at which currents I1, I2 and I3 are determined in equations 1, 2 and 3 need not be identical voltages. The designation of the voltages used to determine currents I1, I2 and I3 as Vcc+ in the above description is used only to simplify the illustration of the present invention. In some embodiments of the invention, some or all of the three voltages may be different voltages. The sources of and/or means for measuring the three currents I1, I2 and I3 may be provided by either off-chip circuitry or by on-chip circuitry.

Additionally, the value $$\frac{V_{cc+}}{I1}$$

of equation 1 need not be calculated before the measurement for equation 2, nor must the value $$\frac{V_{cc}+}{2}$$

be calculated before the measurement for equation 3, nor must the value $$\frac{V_{cc}+}{3}$$

be calculated before the determination of the sought characteristics of the antifuse. Rather, information indicative of the voltage to current relationship in the measurements for equations 1, 2 and 3 may be measured and stored to determine the sought characteristics of the antifuse at a later time. The determinations associated with equations 1, 2 and 3 may therefore each entail a measurement of a voltage and/or a current and/or a resistance and/or a capacitance and/or an inductance which is usable to later determine the sought characteristics of the antifuse.

Moreover, despite the illustration of the invention in connection with the determination of a resistance of a pass antifuse, the invention is usable to determine the resistance of any suitable type of antifuse including pass antifuses and cross antifuses. Furthermore, the presently described method may be employed to determine an electrical characteristic of an antifuse other than a resistance. The method is, for example, usable to determine antifuse capacitance, antifuse inductance, and/or antifuse impedance at a given signal frequency. The method is also usable to determine an electrical characteristic such as resistance of either a series element, a parallel element, or both. Accordingly, various modifications and adaptations of the described embodiments are to be considered with the spirit and scope of the claimed invention as set forth in the appended claims.

We claim:

1. A method of determining an electrical characteristic of an antifuse of a programmable device, said programmable device comprising a series element, a parallel element and said antifuse, said method comprising the steps of:

(a) determining an electrical characteristic of a first conductive path, said first conductive path comprising said series element disposed electrically in series with said parallel element, said parallel element being controlled to be at least substantially conductive;

(b) after step (a), at least partially programming said antifuse;

(c) after step (b), determining an electrical characteristic of a second conductive path, said second conductive path comprising said series element disposed electrically in series with said antifuse, said parallel element being controlled to be substantially nonconductive;

(d) after step (b), determining an electrical characteristic of a third conductive path, said third conductive path comprising said series element disposed electrically in series with said antifuse and said parallel element, said antifuse and said parallel element being disposed electrically in parallel with respect to each other, said parallel element being controlled to be at least substantially conductive; and (e) determining said electrical characteristic of said antifuse based at least in part on said electrical characteristic determined in step (a), said electrical characteristic determined in step (c), and said electrical characteristic determined in step (d).

2. The method of claim 1, wherein said electrical characteristic determined in step (a) is a resistance, wherein said electrical characteristic determined in step (c) is a resistance, and wherein said electrical characteristic determined in step (d) is a resistance.

3. The method of claim 1, wherein said electrical characteristic determined in step (a) is a current flowing in said first conductive path, and wherein said electrical characteristic determined in step (e) is a resistance.

4. The method of claim 1, wherein said electrical characteristic determined in step (a) is a voltage present across said first conductive path, and wherein said electrical characteristic determined in step (e) is a resistance.

5. The method of claim 1, wherein step (a) comprises determining a voltage present across said first conductive path and also comprises determining a current flowing through said first conductive path.

6. The method of claim 1, wherein the determining of step (a) comprises a measurement of a current.

7. The method of claim 1, wherein the determination of step (a) is a measuring of a current.

8. The method of claim 1, wherein said first conductive path extends from a first programming voltage driver, through said series element, and through said parallel element.

9. The method of claim 8, wherein said series element comprises a plurality of conductive pass transistors and a plurality of wires.

10. The method of claim 1, wherein said parallel element comprises a pass transistor.

11. The method of claim 1, wherein said series element comprises a wire and a pass transistor, said wire being connected to said antifuse.

12. The method of claim 1, wherein said step (c) occurs before step (d), and wherein step (d) occurs before step (e).

13. The method of claim 1, wherein said electrical characteristic of said antifuse determined in step (e) is indicative of a reliability of said antifuse.

14. The method of claim 1, further comprising the step of:

after step (e), programming said antifuse further.

15. The method of claim 1, further comprising the step of:

after step (e), determining whether to program said antifuse further based at least in part on said determination of step (e).

16. A method of determining a resistance of an antifuse of a programmable device, said programmable device comprising a series element, a parallel element and said antifuse, said method comprising the steps of:

(a) making a measurement indicative of a resistance of a first conductive path, said first conductive path comprising said series element disposed electrically in series with said parallel element, said parallel element being substantially conductive;

(b) after at least partially programming said antifuse and after step (a), making a measurement indicative of a resistance of a second conductive path, said second conductive path comprising said series element disposed electrically in series with said antifuse, said parallel element being substantially nonconductive;

(c) after step (a), making a measurement indicative of a resistance of a third conductive path, said third conductive path comprising said series element disposed electrically in series with said antifuse and said parallel element, said antifuse and said parallel element being disposed electrically in parallel with respect to each other, said parallel element being substantially conductive; and (d) after steps (a), (b) and (c), determining said resistance of said antifuse.

17. The method of claim 16, wherein said making of said measurement indicative of said resistance of said first conductive path involves measuring a current.

18. The method of claim 16, wherein said making of said measurement indicative of said resistance of said first conductive path involves measuring a voltage.

19. The method of claim 16, wherein said antifuse is a part of a net of a user-specific circuit realized on said programmable device, the method further comprising the step of:

(e) using the resistance determined in step (d) to determine a switching speed of said net.

20. An apparatus for determining a resistance of an antifuse of a programmable device, comprising:

means for measuring a first current supplied to said programmable device when a voltage is coupled across a first conductive path, said first conductive path comprising a series element electrically coupled in series with a parallel element, said means also being for measuring a second current supplied to said programmable device when a voltage is coupled across a second conductive path, said second conductive path comprising said series element electrically coupled in series with said antifuse, said antifuse being at least partially programmed, said parallel element being controlled to be substantially nonconductive, said means also being for measuring a third current supplied to said programmable device when a voltage is coupled across a third conductive path, said third conductive path comprising said series element electrically coupled in series with said antifuse and said parallel element, said antifuse being electrically coupled in parallel with said parallel element, said parallel element being controlled to be substantially conductive; and means for controlling said parallel element.

21. The apparatus of claim 20, wherein said parallel element is a pass transistor associated with said antifuse.

22. The apparatus of claim 20, wherein said apparatus is not disposed on an integrated circuit chip of said programmable device.

23. The apparatus of claim 20, further comprising: means for determining said resistance of said antifuse.

24. An apparatus for programming an antifuse of a programmable device, a pass transistor of said programmable device being disposed electrically in parallel with said antifuse, a series element of said programmable device being disposed electrically in series with said antifuse, said pass transistor having a resistance P when said pass transistor is controlled to be substantially conductive, said series element having a resistance S when said series element is substantially conductive, said antifuse having a resistance L after said antifuse is programmed to be substantially conductive, said resistance P and said resistance L being different resistances, said apparatus having a current measuring capability to resolve a difference in current between each combination of the following currents I1, I2 and I3:

$$I1 = \frac{V1}{S+P}$$

$$I2 = \frac{V2}{S+L}$$

$$I3 = \frac{V3}{S+\frac{LP}{L+P}}$$

wherein V1, V2 and V3 are voltages supplied to said programmable device by said apparatus.

25. The apparatus of claim 24, wherein said series element and said antifuse form a conductive path through said programmable device when said series element is controlled to be substantially conductive and after said antifuse is programmed to be substantially conductive.

26. The apparatus of claim 24, wherein voltage V1 is substantially equal to voltage V2, and wherein voltage V2 is substantially equal to voltage V3.

27. The apparatus of claim 24, wherein said voltages V1, V2 and V3 are substantially equal to a voltage Vcc+, voltage Vcc+ being smaller that a programming voltage Vpp supplied to said programmable device during programming of said antifuse.

28. The apparatus of claim 24, wherein said series element comprises a transistor of said programmable device disposed electrically in series with a wire of said programmable device.

29. The apparatus of claim 24, wherein said current measuring capability enables said apparatus to measure a current flowing through said programmable device with at least ±20 microamps resolution over a range of at least 40 milliamps.

30. The method of claim 1, wherein said antifuse comprises a layer of a dielectric material.

31. The method of claim 15, wherein said antifuse comprises a layer of dielectric material.

32. The method of claim 16, wherein said antifuse comprises a layer of dielectric material.

33. The method of claim 19, wherein said antifuse comprises a layer of dielectric material.

34. The apparatus of claim 24, wherein said antifuse comprises a layer of dielectric material.

35. The apparatus of claim 27, wherein said antifuse comprises a layer of dielectric material.

* * * * *